United States Patent
Yoshioka

(10) Patent No.: US 9,815,624 B2
(45) Date of Patent: Nov. 14, 2017

(54) INTER-FLOOR TRANSPORT FACILITY

(71) Applicant: Daifuku Co., Ltd., Osaka-shi (JP)

(72) Inventor: Hideo Yoshioka, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 170 days.

(21) Appl. No.: 14/797,433

(22) Filed: Jul. 13, 2015

(65) Prior Publication Data

US 2016/0013087 A1 Jan. 14, 2016

(30) Foreign Application Priority Data

Jul. 14, 2014 (JP) .................. 2014-144209

(51) Int. Cl.
| | | |
|---|---|---|
| *B65G 1/06* | (2006.01) | |
| *H01L 21/677* | (2006.01) | |
| *B66B 9/00* | (2006.01) | |

(52) U.S. Cl.
CPC ............... *B65G 1/06* (2013.01); *B66B 9/003* (2013.01); *H01L 21/6773* (2013.01); *H01L 21/67727* (2013.01); *H01L 21/67733* (2013.01); *H01L 21/67769* (2013.01); *H01L 21/67736* (2013.01)

(58) Field of Classification Search
CPC .......... H01L 21/67769; H01L 21/6773; H01L 21/67736; B65G 2201/0297; B65G 1/0407; B65G 1/02; B65G 1/04; B65G 1/0414; B65G 1/065; B65G 1/0492; B65G 1/06; B66B 9/003; B66B 2009/006; B66B 11/02; B66B 11/006; B66B 9/10; B66F 9/07; B66F 7/02

USPC .......... 414/659, 609, 940; 700/255
See application file for complete search history.

(56) References Cited

U.S. PATENT DOCUMENTS

| | | | | |
|---|---|---|---|---|
| 1,859,483 | A * | 5/1932 | Winslow ................. | B66B 9/003 187/270 |
| 4,279,563 | A * | 7/1981 | Miller ................... | B66B 11/006 191/2 |
| 6,113,336 | A * | 9/2000 | Chang ...................... | B66F 9/07 414/281 |
| 7,871,231 | B2 * | 1/2011 | Oshima .................. | B65G 47/54 198/349.1 |
| 8,206,077 | B2 * | 6/2012 | Ishikawa ................ | B65G 37/02 212/332 |

(Continued)

FOREIGN PATENT DOCUMENTS

JP 2009137675 A 6/2009

*Primary Examiner* — Glenn Myers
(74) *Attorney, Agent, or Firm* — The Webb Law Firm

(57) ABSTRACT

An inter-floor transport facility in which a raising and lowering transport device is provided for each of the raising and lowering paths that are adjacent to each other. Receiving platforms include a carry in article receiving platform for supporting an article that is being carried in to the floor, a carry out article receiving platform for supporting an article that is being carried out from the floor, and a storage-purpose receiving platform for storing a transported article. On each floor, the carry in article receiving platform and the carry out article receiving platform are so located that the article can be transferred between one transfer device and both of the carry in article receiving platform and the carry out article receiving platform, and the storage-purpose receiving platform is so located that all of the transfer devices can transfer the article to or from the storage-purpose receiving platform.

7 Claims, 9 Drawing Sheets

(56) References Cited

U.S. PATENT DOCUMENTS

| | | | | |
|---|---|---|---|---|
| 8,388,296 | B2* | 3/2013 | Suzuki | H01L 21/67769 |
| | | | | 414/221 |
| 8,827,621 | B2* | 9/2014 | Inagaki | H01L 21/67733 |
| | | | | 414/282 |
| 2005/0135905 | A1* | 6/2005 | Moriya | B65G 49/067 |
| | | | | 414/222.01 |
| 2006/0081181 | A1* | 4/2006 | Miyazaki | C23C 16/4405 |
| | | | | 118/715 |
| 2008/0075564 | A1* | 3/2008 | Tachibana | H01L 21/67733 |
| | | | | 414/217 |
| 2013/0175908 | A1* | 7/2013 | Chang | H01L 21/67769 |
| | | | | 312/223.1 |

* cited by examiner

INTER-FLOOR TRANSPORT FACILITY

CROSS-REFERENCE TO RELATED APPLICATION

This application claims priority to Japanese Patent Application No. 2014-144209 filed Jul. 14, 2014, the disclosure of which is hereby incorporated in its entirety by reference.

FIELD OF THE INVENTION

The present invention relates to an inter-floor transport facility for transporting articles among a plurality of floors.

RELATED ART

JP Publication of Application No. 2009-137675 discloses an inter-floor transport facility that transport containers for carrying substrates in a semiconductor processing facility in which substrate processing devices are provided on a plurality of floors (i.e., upper floor and lower floor). In this inter-floor transport facility, the articles are transported among the plurality of floors by a raising and lowering transport device. The inter-floor transport facility includes article support portions which function as carry in article receiving platforms for supporting articles being carried in to the upper floor and the lower floor and carry out article receiving platforms for supporting articles being carried out of the upper floor and the lower floor. Article storage sections for temporarily storing the articles are also provided to the upper floor and the lower floor. The raising and lowering transport device includes a transfer device which can transfer an article among the article support portions, the article storage sections, and the raising and lowering transport device (see FIG. 1 -FIG. 3, [0021], [0026], etc.). Note that article storage sections are used to temporarily store articles, for example, when an article received on one floor cannot be immediately handled on a different floor during the transporting of the article among the plurality of floors due to, among other causes, the differences in the processing timing of the articles among different floors. The inter-floor transport facility of the JP Publication of Application No. 2009-137675 is an example of such facility provided with only one unitary transport facility which includes the raising and lowering transport device, the article support portions, and the article storage sections.

When there is only one unitary transport facility, a malfunction of the raising and lowering transport device of the unitary transport facility will result in a situation where articles cannot be transported among the plurality of floors. If the facility is, for example, an inter-floor transport facility of a semiconductor processing facility, it may become impossible to continue production of semiconductors. It is conceivable to provide two or more unitary transport facilities in order to avoid such a situation. However, although transporting of the articles among the plurality of floors can be continued if two or more unitary transport facilities are provided, the article that are stored in the article storage sections provided for the raising and lowering transport device that malfunctioned would still be left on the storage-purpose receiving platforms.

SUMMARY OF THE INVENTION

To this end, an inter-floor transport facility is desired in which even if a raising and lowering transport device malfunctions, the transporting function of an inter-floor transport facility can be maintained and articles would not have to be left in the storage sections for temporary storage.

In one embodiment, an inter-floor transport facility for transporting articles among a plurality of floors comprises: raising and lowering paths with each raising and lowering path extending through the plurality of floors; raising and lowering transport devices for transporting the articles among the plurality of said floors, each raising and lowering transport device being configured to be raised and lowered along associated one of the raising and lowering paths; wherein each of the raising and lowering transport devices having a raised-and-lowered member for transporting an article, and configured to be raised and lowered along associated one of the raising and lowering paths, and a transfer device for transferring, on each floor, a transported article among receiving platforms for supporting the articles and the raising and lowering transport device, the transfer device configured to be raised and lowered integrally with the raised-and-lowered member, wherein the receiving platforms include a carry in article receiving platform for supporting an article that is being carried in to an associated floor, a carry out article receiving platform for supporting an article that is being carried out from the associated floor, and a storage-purpose receiving platform for temporarily storing a transported article on the associated floor, wherein on each floor, the carry in article receiving platform and the carry out article receiving platform are so located that the article can be transferred between one said transfer device and both of the carry in article receiving platform and the carry out article receiving platform, and wherein on each floor, the storage-purpose receiving platform is so located that all of the transfer devices can transfer the article to or from the storage-purpose receiving platform.

That is, since a plurality of raising and lowering transport devices are provided, even if any of the plurality of raising and lowering transport devices malfunctions, the transporting operation can continue using the raising and lowering transport device or devices that is or are functioning properly so that the transporting function of the whole system can be maintained. In addition, the transfer devices of all the raising and lowering transport devices for the plurality of raising and lowering paths can transfer articles to the storage-purpose receiving platform; thus, even if one of the raising and lowering transport devices malfunctions, the article supported by the storage-purpose receiving platform can be carried out by other raising and lowering transport device or devices. Therefore, no article would have to be left on the storage-purpose receiving platform because of a malfunction. As such, with the arrangement described above, an inter-floor transport facility can be provided in which, even if one of the raising and lowering transport devices malfunctions, the transport function of the inter-floor transport facility can be maintained and in which no article would have to be left on the storage-purpose receiving platform.

Additional features and advantages of the inter-floor transport facility will become clear from the following description of the embodiments described with reference to the drawings.

DETAILED DESCRIPTION

Figure 1:
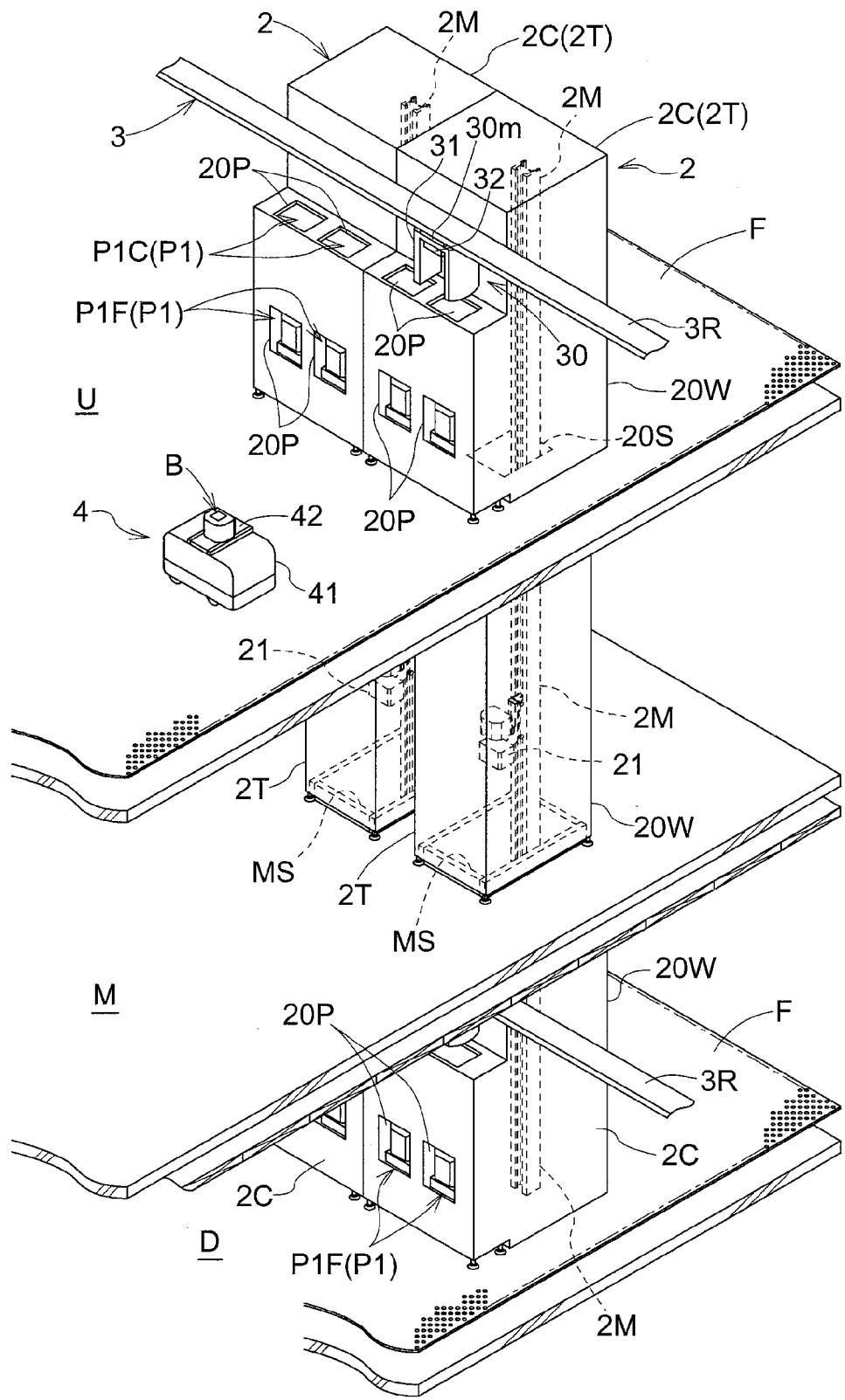
FIG. 1 is a perspective view of an entire inter-floor transport facility.
Figure 2:
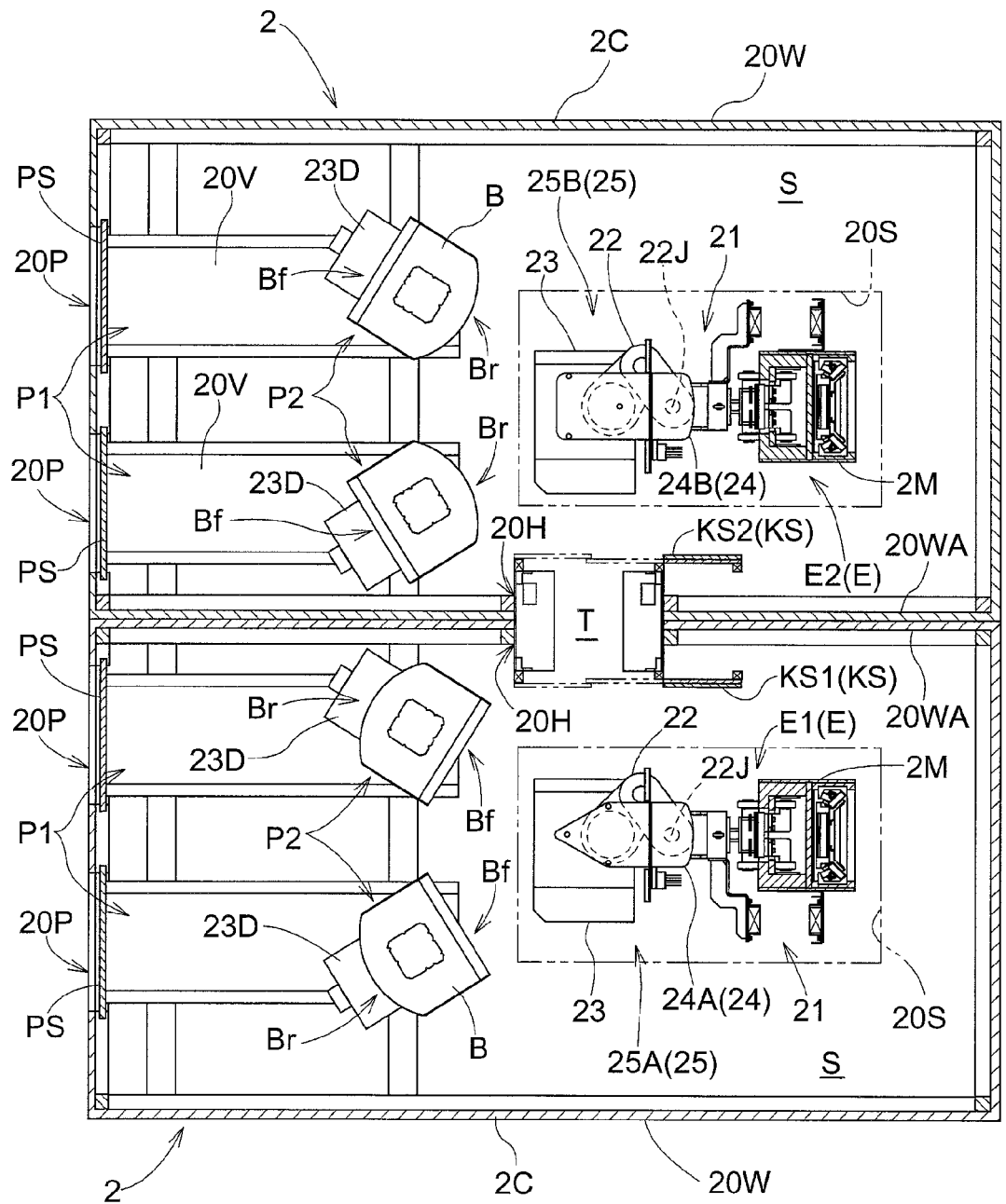
FIG. 2 is a plan view of a principal portion of the inter-floor transport facility.

Embodiments in which an inter-floor transport facility in accordance with the present invention is applied to a semiconductor processing facility are described next with reference to the drawings. In the present embodiment, containers B for storing, carrying, or holding semiconductor substrates are the articles to be transported. In addition, the semiconductor processing facility has a plurality of floors along the up-and-down direction (the vertical direction)(the upper floor U, the intermediate floor M, and the lower floor D as shown in FIG. 1). As shown in FIGS. 1 and 2, the semiconductor processing facility is provided with two inter-floor transport facilities 2 for transporting containers B (articles) among the plurality of floors (U, M, D) such that the two inter-floor transport facilities 2 are located side by side as seen in plan view (i.e., as seen along the vertical direction).

For example, a processing device (not shown) which performs cleaning or one or more processing steps on semiconductor substrates, etc., and a storage facility (not shown) which stores the containers B are provided on each of the upper floor U and the lower floor D. In addition, in-floor transport devices (a overhead transport device 3 and the floor travel type transport device 4) for transporting containers B among these processing devices and storage facilities, etc., and the outer container transfer locations P1 of the inter-floor transport facilities 2 are also provided. The inter-floor transport facilities 2 are used when transporting containers B between the processing devices and storage devices, etc., provided on different floors. Note that in the present embodiment, no in-floor transport devices (3, 4) for transferring containers B to or from the inter-floor transport facilities 2 are provided on the intermediate floor M provided between the upper floor U and the lower floor D; however, the intermediate floor M may also be provided with in-floor transport devices (3, 4).

A FOUP (Front-Opening Unified Pod) is one preferable example of the container B. Each container B has a flange for transporting provided in its upper end, and an opening defining portion to which a lid can be detachably attached is provided in its front face (shown with reference numeral Bf in FIG. 2). The back (shown with reference numeral Br in FIG. 2) of the container B is closed. Each container B houses or carries, in its inner housing space, disk-shaped semiconductor substrates such that the plurality of substrates are arranged one above another, or spaced apart from each other in the vertical direction. In the following description, the direction from the front face Bf to the back face Br of the container B will be referred to as the depth-wise direction of the container B. While not shown, the bottom portion of the container B is provided with three guide grooves each extending radially from a central portion of the bottom portion in plan view. Two of the three guide grooves are located toward the front face Bf of the container B with respect to the depth-wise direction of the container B and are spaced apart from each other in a lateral direction that is perpendicular to the depth-wise direction of the container B whereas the remaining one of the three guide grooves is located toward the back face Br of the container B with respect to the depth-wise direction of the container B, and is formed in the center area along the lateral direction which is perpendicular to the depth-wise direction of the container B.

As shown in FIGS. 1 and 2, a portion, on the upper floor U and also on the lower floor D, of each raising and lowering space defining body 2T has an entrance and exit defining portion 2C that forms openings 20P through which containers B are carried in and out between the exterior and the interior of the raising and lowering space defining body 2T. Each entrance and exit defining portion 2C includes upper outer container transfer locations P1C and lower outer container transfer locations P1F. Each upper outer container transfer location P1C is an outer container transfer location P1 for transferring a container B to or from a overhead transport devices 3. And each lower outer container transfer location P1F is an outer container transfer location P1 for transferring a container B to or from a floor travel type transport device 4. In the description below, the upper outer container transfer locations P1C and the lower outer container transfer locations P1F are collectively referred to as the outer container transfer locations P1 unless they need to be distinguished from each other.

Each opening 20P is provided with a shutter PS for preventing or blocking communication of air between the exterior and the interior of the raising and lowering space defining body 2T. Each shutter PS is opened and closed by means of an actuating mechanism (not shown). The shutter PS is configured to be opened only when transferring an container B between the overhead transport device 3 or the floor travel type transport device 4 and the outer container transfer location P1, and to be kept closed when no container B is transferred.

The entrance and exit defining portion 2C is provided with container carrying conveyors 20V each of which can transport a container B by causing a vehicle (not shown) to travel with the container B placed on a transport container support 23D provided to the vehicle. Each transport container support 23D is rotatable about a rotating shaft extending along a vertical axis. This arrangement makes it possible to change the orientation of the container B supported by the transport container support 23D in plan view.

In the present embodiment, in each entrance and exit defining portion 2C, two (or a pair of) container carrying conveyors 20V are located next to each other in a horizontal direction. And two such pairs of the container carrying conveyors 20V are provided to each entrance and exit defining portion 2C with one pair located above the other pair in the vertical direction. In other words, in the present embodiment, two pairs of container carrying conveyors 20V include a pair of upper container carrying conveyors 20V and a pair of lower container carrying conveyors 20V. The pair of upper container carrying conveyors 20V (not shown) are ones for which articles are carried in and out by an overhead transport device 3. The pair of the lower container carrying conveyors 20V (FIG. 2) are ones for which articles are carried in and out by a floor travel type transport device 4. Note that, in the following description, unless explicitly stated, no distinction will be made between an upper container carrying conveyor 20V and a lower container carrying conveyor 20V, or between the two container carrying conveyors 20V (one for carrying in articles and the other for carrying out articles as described below) that are located next to each other in the horizontal direction; and, they will all be referred to simply as container carrying conveyors 20V in the description.

One end of each container carrying conveyor 20V corresponds to an outer container transfer location P1, and the other end of each container carrying conveyor 20V corresponds to an inner container transfer location P2. Each container carrying conveyor 20V is so located that its one end (outer container transfer location P1) is close to a corresponding opening 20P of the entrance and exit defining portion 2C and the other end (inner container transfer location P2) is at a position that allows a transfer of a container B to or from the transfer device 25 of the raising and lowering transport device E. The containers B are transferred, through the container carrying conveyor 20V, between an overhead transport device 3 or a floor travel type transport device 4 and the raising and lowering transport device E.

In the present embodiment, one of the two container carrying conveyors 20V that are located next to each other in the horizontal direction is used as a container carrying conveyor 20V for carrying, which transports containers B that are being carried into a floor whereas the other of the two is used as a container carrying conveyor 20V for carrying out, which transports containers B that are being carried out of the floor. And in the present embodiment, the transport container support 23D located at the inner container transfer location P2 of the container carrying conveyor 20V for carrying in functions as a carry in article receiving platform. In addition, the transport container support 23D located at the inner container transfer location P2 of the container carrying conveyor 20V for taking out functions as a carry out article receiving platform. As such, in the present embodiment, the carry in article receiving platform for supporting a container B that is being carried into a floor, and the carry out article receiving platform for supporting a container B that is being carried out of the floor are provided to function as receiving platforms.

As shown in FIG. 1, the overhead, or ceiling, transport device 3, includes an overhead transport vehicle 30 which can travel along a guide rail 3R. The guide rail 3R is so provided that it extends above, or by way of, upper outer container transfer locations P1C formed in the entrance and exit defining portion 2C. Although description is not given in detail, the overhead transport vehicle 30 generally includes a vehicle body 30m which travels along the guide rail 3R by propelling force from a motor etc., while being guided and supported by the guide rail 3R, an outer frame 31 equipped with wire spooling portion for spooling and feeding out wires, and a grip portion 32 for gripping, or holding, a container B while being suspended and supported by, and at distal ends of, the wires.

The overhead transport vehicle 30 is configured to be able to perform unloading operation in which it unloads a container B onto the transport container support 23D as well as pick up operation in which it receives a container B from a transport container support 23D, with the vehicle body 30m stopped above an upper outer container transfer location P1C after the vehicle body 30m is moved along the guide rail 3R to that location. More specifically, the unloading operation is an operation in which the grip portion 32 which is gripping a container B is lowered, and subsequently, the gripping of the container B by the grip portion 32 is released to unload the container B onto the transport container support 23D located at the upper outer container transfer location P1C. The pick up operation is an operation in which the grip portion 32 which is not gripping any container B is lowered, and subsequently, the grip portion 32 is caused to grip a container B placed on the transport container support 23D located at the upper outer container transfer location P1C to receive, or pick up, the container B from the transport container support 23D.

Each floor travel type transport device 4 includes a transport conveyor 42, and an article transport vehicle 41 which can travel on the floor F along a travel path. The transport conveyor 42 is provided at the top portion of the article transport vehicle 41 to receive and support a container B and to transport the container in a horizontal direction. In other words, the transport conveyor 42 supports and transports a container B at the top portion of the article transport vehicle 41.

The floor travel type transport device 4 is configured to be able to perform unloading operation in which it unloads a container B onto a transport container support 23D as well as pick up operation in which it receives a container B from a transport container support 23D, with its article transport vehicle 41 stopped at a lateral side of a lower outer container transfer location P1F formed in the entrance and exit defining portion 2C. More specifically, the unloading operation is an operation in which a container B on the transport conveyor 42 is unloaded onto the transport container support 23D located at the lower outer container transfer location P1F by actuating the transport conveyor 42. And the pick up operation is an operation in which a container B is picked up from a transport container support 23D located at the lower outer container transfer location P1F onto the transport conveyor.

As shown in FIGS. 1 and 2, each inter-floor transport facility 2 includes the raising and lowering space defining body 2T which is tubular in shape. A raising and lowering mast 2M, a raised-and-lowered member 21, and a transfer device 25 are provided within the interior space S of each raising and lowering space defining body 2T. The raising and lowering mast 2M extends from a location near the floor F of the lower floor D to a location near the ceiling of the upper floor U, through a passage opening 20S formed in the floor F of the upper floor U and a passage opening MS formed in the floor F of the intermediate floor M. The raised-and-lowered member 21 is suspended and supported by a raising and lowering belt (not shown), and can be vertically moved, or raised and lowered, along the raising and lowering mast 2M by the driving force of a raising and lowering actuator 26 (see FIG. 7) which moves the raising and lowering belt along its longitudinal direction. The transfer device 25 can be raised and lowered in unison, or integrally, with the raised-and-lowered member 21 and is capable of transferring a container B to and from receiving platforms described below. That is, each raising and lowering path of the raised-and-lowered member 21 is defined along the raising and lowering mast 2M. Also, a plurality of raising and lowering paths are defined such that they are close to each other. And a raising and lowering transport device E is provided to each of the plurality of raising and lowering paths.

Figure 3:
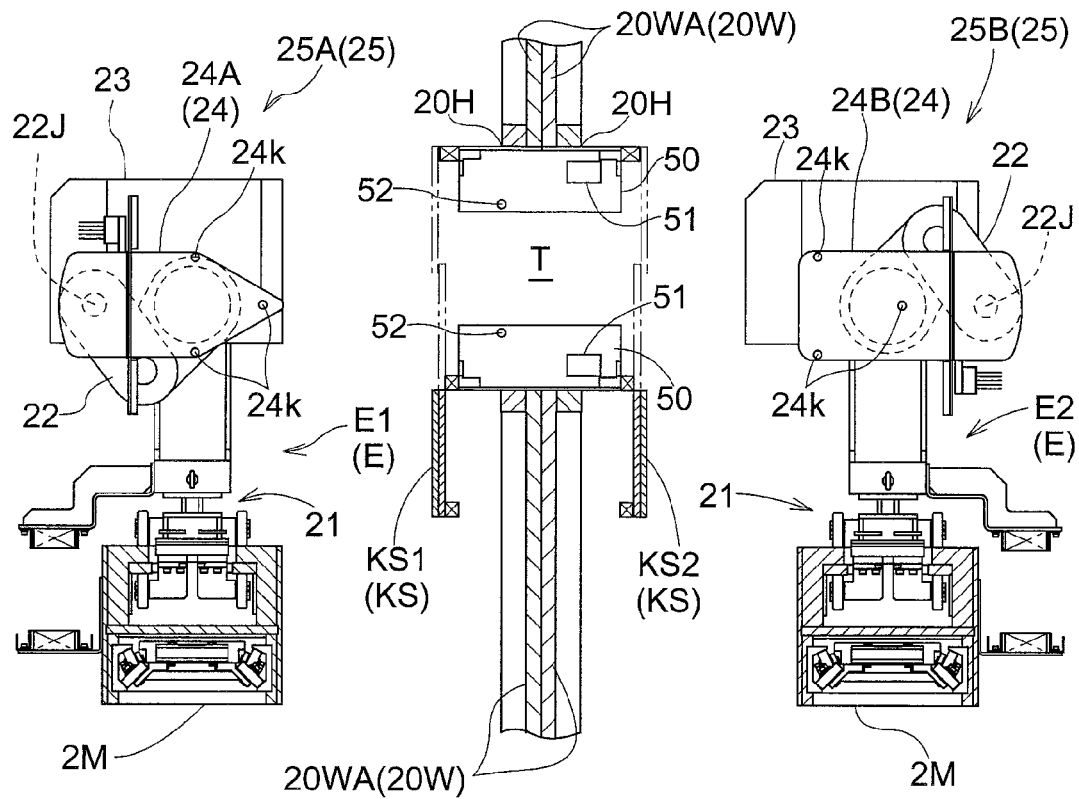
FIG. 3 is a plan view showing a positional relationship between two adjacent raising and lowering transport devices and a storage-purpose receiving platform.

As shown in FIG. 3, the transfer device 25 includes an arm 22 which is capable of bending and stretching at its joint to extend and contract in a horizontal plane and which can be pivoted in the horizontal plane, an arm actuator 23 for actuating the arm 22 to cause it to bend and stretch, and to be pivoted, and a transfer support 24 for receiving and supporting a container B. The transfer support 24 is connected to a pivot 22J provided at the distal end of the arm 22 such that the transfer support 24 can be rotated about the vertical axis.

Figure 5:
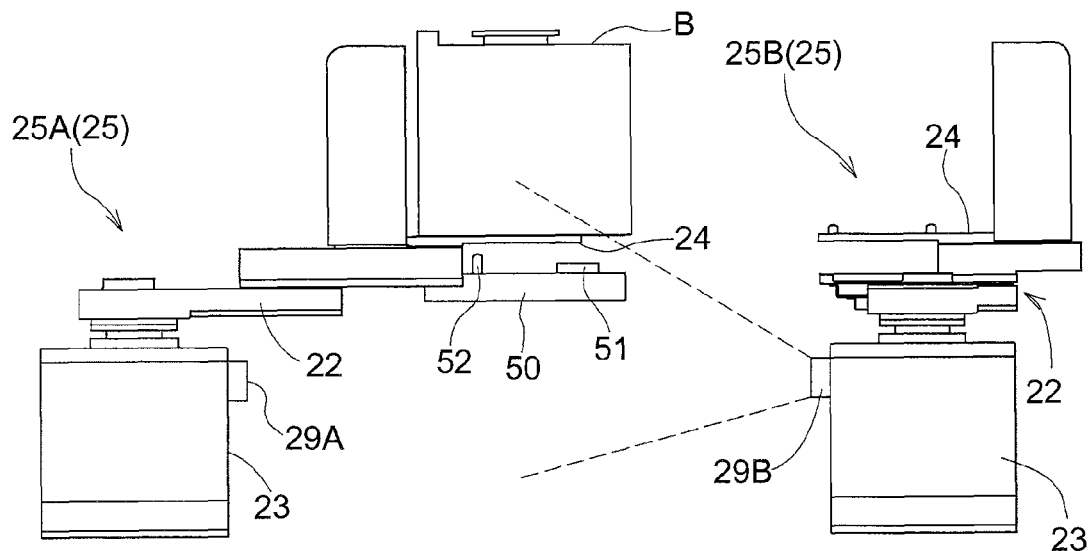
FIG. 5 is a schematic diagram showing a detecting function of a proximity sensor.

In addition, as shown in FIG. 5, each of the transfer devices 25 (first transfer device 25A and second transfer device 25B) of the plurality of raising and lowering transport devices E is provided with a proximity sensor 29 for detecting an approach of, or proximity to, the transfer device 25 for the other raising and lowering transport device E. The proximity sensor 29 is an area sensor, and can detect the transfer support 24 for the other raising and lowering transport device E when it is located within a predetermined range. In the present embodiment, each raising and lowering transport device E includes, as its main components, the raising and lowering mast 2M, the raised-and-lowered member 21, the arm 22, the arm actuator 23, and the transfer device 25 equipped with the transfer support 24. Thus, each raising and lowering transport device E can transport containers B, one at a time, between the upper floor U and the lower floor D. The proximity sensor 29 is not limited to an area sensor described above, and may be, for example, a distance sensor, or a range sensor that uses infrared light, or ultrasound, etc., or a shape recognition device that utilizes a CCD camera, etc.

Figure 7:
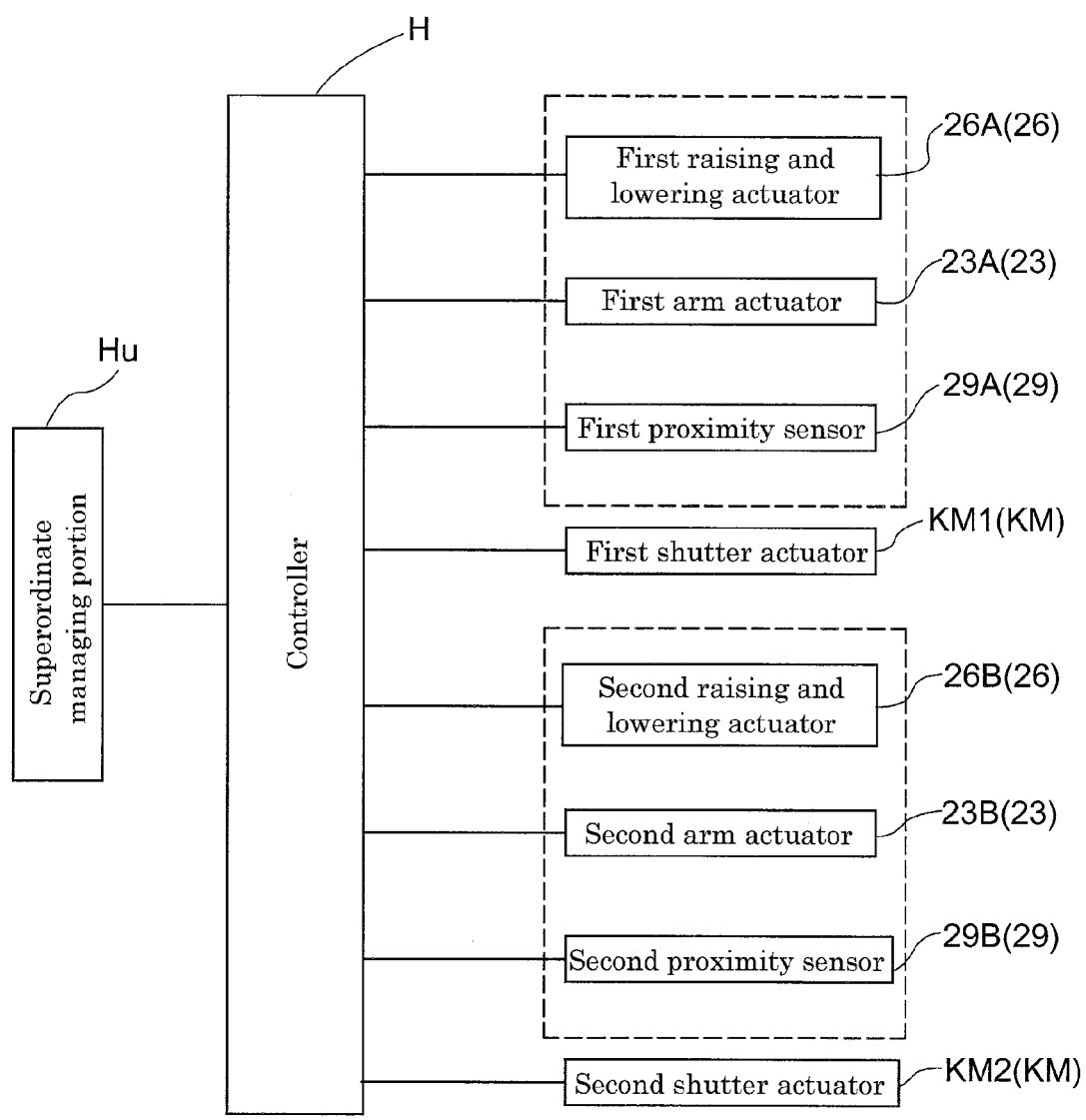
FIG. 7 is a control block diagram.

In addition, in the present embodiment, each raising and lowering transport device E includes one raised-and-lowered member 21 in the vertical direction; and, the raised-and-lowered member 21 includes one transfer support 24 in the vertical direction. In the present embodiment, two raising and lowering transport devices E, each of which is configured as described above, are provided. And one of the two raising and lowering transport devices E will be referred to as the first raising and lowering transport device E1 whereas the other of the two will be referred to as the second raising and lowering transport device E2 (see FIGS. 2 and 3, for example). In addition, as shown in FIG. 7, the raising and lowering actuator 26 of the first raising and lowering transport device E1 will be referred to as the first raising and lowering actuator 26A. The arm actuator 23 for the first raising and lowering transport device E1 will be referred to as the first arm actuator 23A. And the proximity sensor 29 for the first raising and lowering transport device E1 will be referred to as the first proximity sensor 29A. Similarly, the raising and lowering actuator 26 of the second raising and lowering transport device E2 will be referred to as the second raising and lowering actuator 26B. The arm actuator 23 for the second raising and lowering transport device E2 will be referred to as the second arm actuator 23B. And the proximity sensor 29 for the second raising and lowering transport device E2 will be referred to as the second proximity sensor 29B.

The entrance and exit defining portion 2C of the inter-floor transport facility 2 is surrounded by a wall 20W which divides the interior space S and the exterior space. As shown in FIG. 2, the wall 20W is rectangular in shape in plan view. In addition, in the present embodiment, the two raising and lowering space defining bodies 2T are located next to each other such that their respective surfaces in which the outer container transfer locations P1 are provided face the same direction and such that their walls 20WA, that define adjacent side faces located next to each other in the direction along which the two raising and lowering space defining bodies 2T are located next to each other, are so located that the walls 20WA are in contact with each other. The walls 20WA have communication hole defining portions 20H which allow the interior spaces of the adjacent raising and lowering space defining bodies 2T to be in communication with each other. While not shown, each communication hole defining portion 20H has its lower edge at a set height from the top surface of the floor F and its upper edge which is lower than the upper end of the entrance and exit defining portion 2C by a set height. Note that width of the opening, in the horizontal direction, of the communication hole defining portion 20H is formed to be greater than the lateral (or right and left) width of the container B as seen along its depth-wise direction.

In the communication hole defining portion 20H, a storage-purpose receiving platform T (a kind of a receiving platform) is provided for temporarily storing a container B that is being transported and is on its way from a receiving platform for articles being carried in (carry in article receiving platform) on a certain floor to a receiving platform for articles being carried out (carry out article receiving platform) of another floor. In FIGS. 2 through 6, etc., an example is illustrated in which only one storage-purpose receiving platform T is provided; however, it is preferable that a plurality of storage-purpose receiving platforms T are provided along the vertical direction (i.e., along the raising and lowering path) with one located above another. In other words, the storage-purpose receiving platforms T can temporarily store a plurality of articles. Each of the storage-purpose receiving platforms T includes a pair of right and left receiving supports 50 each of which supports a container B placed thereon. The pair of receiving supports 50 are located to provide a sufficient distance therebetween such that the transfer support 24 is allowed to pass through between them (see FIG. 4). Each storage-purpose receiving platform T functions as a platform for receiving loads in a broad sense as in the case of the carry in article receiving platform (transport container support 23D located at an inner container transfer location P2) and the carry out article receiving platform (transport container support 23D located at an inner container transfer location P2).

As shown in FIG. 3, three support pins 24k for engaging corresponding guide grooves formed in the bottom surface of the container B are provided to the top surface of the transfer support 24. The transfer support 24 is either a first transfer support 24A that tapers, in plan view, toward a distal end away from the pivot 22J from the proximal end close to the pivot 22J, or a second transfer support 24B whose distal end side portion away from the pivot 22J and proximal end side portion close to the pivot 22J have approximately the same width in plan view. In the following description, the direction from the proximal end side of the transfer support 24 toward the distal end in plan view will be referred to as the depth-wise direction of the transfer support whereas the direction that perpendicularly intersects the depth-wise direction of the transfer support in plan view will be referred to as the width direction of the transfer support.

Two support pins 24k are located on the proximal end side of the first transfer support 24A such that they are spaced apart from each other in the width direction of the transfer support 24 while one support pin 24k is located on the distal end side. Therefore, the first transfer support 24A supports a container B with the orientation (first orientation) in which the front face Bf of the container B faces toward the proximal end side. One support pin 24k is located in a middle area in the width direction on the proximal end side of the second transfer support 24B while two support pins 24k are located on the distal end side such that they are spaced apart from each other in the width direction of the transfer support 24. Therefore, the second transfer support 24B supports a container B with the orientation (first orientation) in which the back face Br of the container B faces toward the proximal end side.

Figure 6:
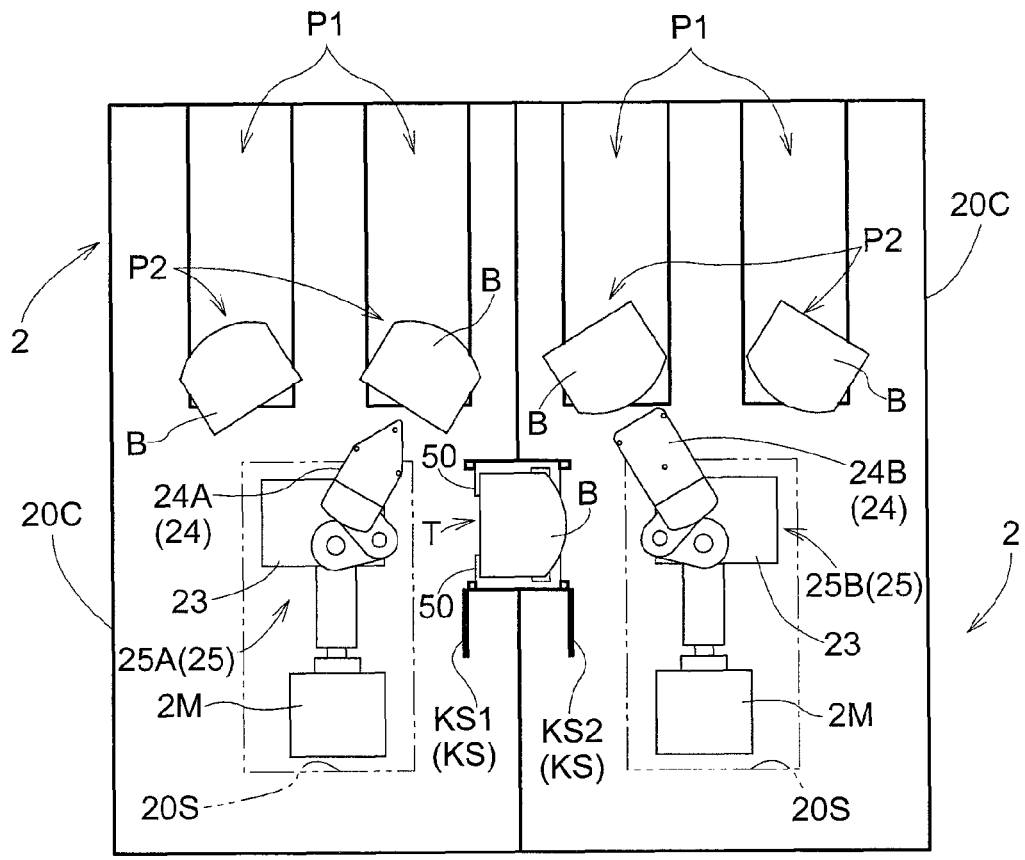
FIG. 6 shows how containers are supported on storage-purpose receiving platforms.

As shown in FIGS. 3 and 6, between the raising and lowering transport devices E for adjacent raising and lowering paths (referred to hereinafter as the adjacent raising and lowering transport devices E), one of the adjacent raising and lowering transport devices E has one of the first transfer support 24A and the second transfer support 24B while the other of the adjacent raising and lowering transport devices E has the other of the first transfer support 24A and the second transfer support 24B so that the two adjacent raising and lowering transport devices E have transfer supports 24 of different types. That is, while each of a plurality of transfer devices 25 has a transfer support 24 for supporting a container B being transported, at least two (E1, E2) of the raising and lowering transport devices, among the raising and lowering transport devices E for which respective raising and lowering paths are adjacent each other, have transfer supports 24 of different types. More specifically, the transfer device 25 (first transfer device 25A), provided to one (the first raising and lowering transport device E1) of the at least two of the raising and lowering transport devices E among the raising and lowering transport devices E for which respective raising and lowering paths are adjacent each other, is provided with the first transfer support 24A that supports a container B in the first orientation, as its transfer support 24. And the transfer device 25 (second transfer device 25B), provided to the other (the second raising and lowering transport device E2) of the at least two of the raising and lowering transport devices E, is provided with the second transfer support 24B that supports a container B in the second orientation, which is different from the first orientation, as its transfer support 24.

In the present embodiment, the first transfer device 25A (with the first transfer support 24A) and the second transfer device 25B (with the second transfer support 24B) are located at symmetrical positions (line-symmetrical in the present embodiment) with respect to the storage-purpose receiving platform T located therebetween. The container B (article) is placed on the storage-purpose receiving platform T with its front face Bf facing toward one of the transfer devices 25 and its back face Br facing toward the other of the transfer devices 25. In the present embodiment, the container B is placed on the storage-purpose receiving platform T with its front face Bf facing toward the first transfer device 25A (with the first transfer support 24A) and its back face Br facing toward the second transfer device 25B (with the second transfer support 24B). The first transfer device 25A transfers a container B by inserting the first transfer support 24A below the undersurface of the container B from the front face Bf side of the container B and holding or supporting it in the first orientation. And the second transfer device 25B transfers a container B by inserting the second transfer support 24B below the undersurface of the container B from the back face Br side of the container B and holding or supporting it in the second orientation.

The first transfer device 25A holds or supports a container B in the first orientation during all of the transfer of a container B between a carry in article receiving platform and the first transfer device 25A, the transfer of a container B between a carry out article receiving platform and the first transfer device 25A, and the transfer of a container B between the storage-purpose receiving platform T and the first transfer device 25A. The second transfer device 25B holds or supports a container B in the second orientation during all of the transfer of a container B between a carry in article receiving platform and the second transfer device 25B, the transfer of a container B between a carry out article receiving platform and the second transfer device 25B, and the transfer of a container B between the storage-purpose receiving platform T and the second transfer device 25B. For example, a container B, which the first transfer device 25A transfers to the storage-purpose receiving platform T with the container B in the first orientation, would have its back face Br facing toward the second transfer device 25B. Therefore, the second transfer device 25B can transfer the container B from the storage-purpose receiving platform T to other locations with the container in the second orientation without having to change the orientation of the container B placed on the storage-purpose receiving platform T in any way. The same is true when the first transfer device 25A transfers a container B, which the second transfer device 25B transfers to the storage-purpose receiving platform T, to other locations.

Figure 4:
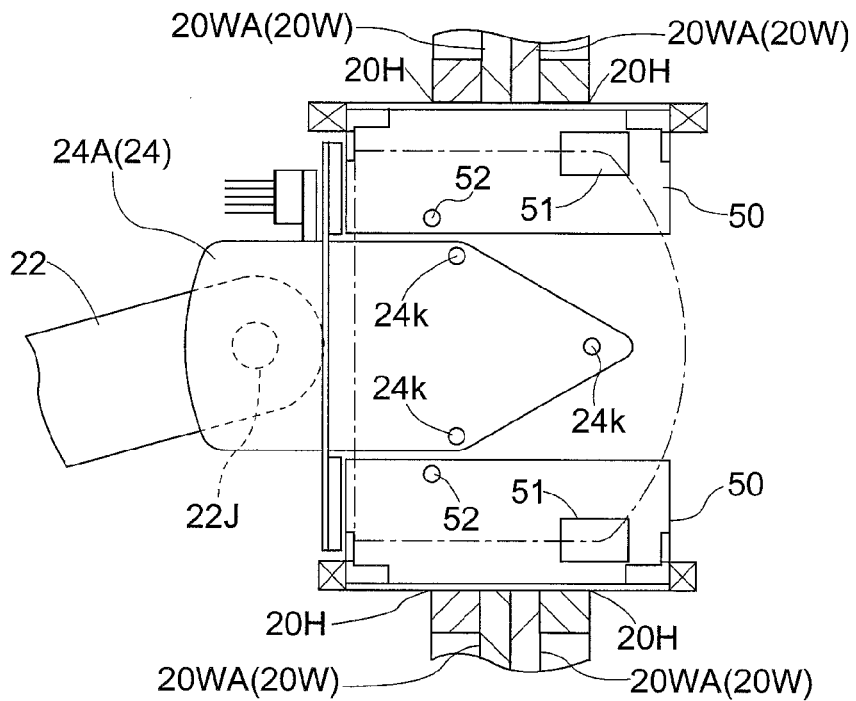
FIG. 4 is a plan view showing a positional relationship between receiving supports and a transfer support during a transfer of a container.

As shown in FIGS. 3 and 4, a support block 51 for supporting, from below, the bottom portion near the back face Br of a container B and a support pin 52 which can engage corresponding one of the two guide grooves located toward the front face Bf of the container B are attached or mounted to each of the pair of receiving supports 50. The support blocks 51 have respective outward end portions with respect to a direction along which the two support blocks 51 are spaced apart from each other, with each end portion having a sloped surface or portion that is higher toward its outward end.

When a container B is delivered or transferred to the pair of receiving supports 50 from the transfer support 24, the transfer support 24 supporting the container B is lowered and passes through between the pair of receiving supports 50. When this happens, as the transfer support 24 is lowered, the support pins 52 come into engagement with the two guide grooves located toward the front face Bf of the container B whereas the bottom portions located toward the back face Br of the container B are guided by the respective sloped surfaces of the pair of receiving supports 50. Thereby, the container B is guided to its proper supporting position of the receiving supports 50 and comes to be properly positioned and supported in the proper supporting position of the receiving supports 50.

In addition, when a container B is delivered or transferred to the transfer support 24 from the pair of receiving supports 50, the transfer support 24 is raised and passes through between the pair of receiving supports 50 supporting the container B. When this happens, the support pins 24k described above come into engagement with the three guide grooves formed in the bottom portion of the container B as the transfer support 24 is raised. By means of this process, the container B is guided to its proper supporting position of the transfer support 24 and comes to be properly positioned and supported in the proper supporting position of the transfer support 24.

The transfer of a container B between the transfer support 24 and the pair of receiving support 50 described above can be performed equally between either one of the first transfer support 24A and the second transfer support 24B, and the pair of receiving supports 50. In addition, the storage-purpose receiving platform T is configured to support the container B in a fixed orientation, as shown in FIGS. 4 and 6. Therefore, the storage-purpose receiving platform T having the pair of receiving supports 50 can be shared by both of the adjacent raising and lowering transport devices E. In other words, the storage-purpose receiving platform T, that is the transfer target of (or, to which an article is transferred to by) each of the transfer devices 25 of at least two raising and lowering transport devices E, is configured to support the container B in the same orientation regardless of whether the container B has been transferred thereto by the transfer device 25 provided to one raising and lowering transport device E or by the transfer device 25 provided to the other raising and lowering transport device E.

As described above, in the present embodiment, the transport container support 23D of the container carrying conveyor 20V and the storage-purpose receiving platform T are, or function as, receiving platforms. That is, the inter-floor transport facility 2 is provided with the raising and lowering transport devices E for transporting containers B among a plurality of floors with each raising and lowering transport device E including the raised-and-lowered member 21 for transporting articles, one at a time, which can be raised and lowered along the raising and lowering path extending through or among a plurality of floors, and the transfer device 25 which is raised and lowered in unison, or integrally, with the raised-and-lowered member 21 and which is configured to transfer the container B being transported to and from the transport container support 23D of the container carrying conveyor 20V or the storage-purpose receiving platform T, for supporting the container B on the floor. In addition, a plurality of the raising and lowering paths extending along respective raising and lowering masts 2M are provided and one raising and lowering transport device E is provided for each of the plurality of raising and lowering paths. And the storage-purpose receiving platform T is provided, as a receiving platform, which each of the transfer devices 25 of the raising and lowering transport devices E provided for adjacent raising and lowering paths transfers articles B, one at a time, to or from. In other words, the term "adjacent raising and lowering transport devices E" refers to a plurality of adjacent raising and lowering transport devices E that share a common storage-purpose receiving platform T.

A first shutter KS1 opened and closed by a first shutter actuator KM1 (see FIG. 7) is provided to a side portion of the storage-purpose receiving platform T that is on the side of the first raising and lowering transport device E1. And a second shutter KS2 opened and closed by a second shutter actuator KM2 (see FIG. 7) is provided to a side portion of the storage-purpose receiving platform T that is on the side of the second raising and lowering transport device E2. Each of the first shutter KS1 and second shutter KS2 extends to cover the entire vertical dimension of the communication hole defining portion 20H. Note that each of the first shutter KS1 and the second shutter KS2 only needs to have a height that corresponds to the workspace for workers and therefore that an arrangement may be adapted in which the shutter KS1 and the second shutter KS2 are not provided to the space higher than the workspace.

Figure 9:
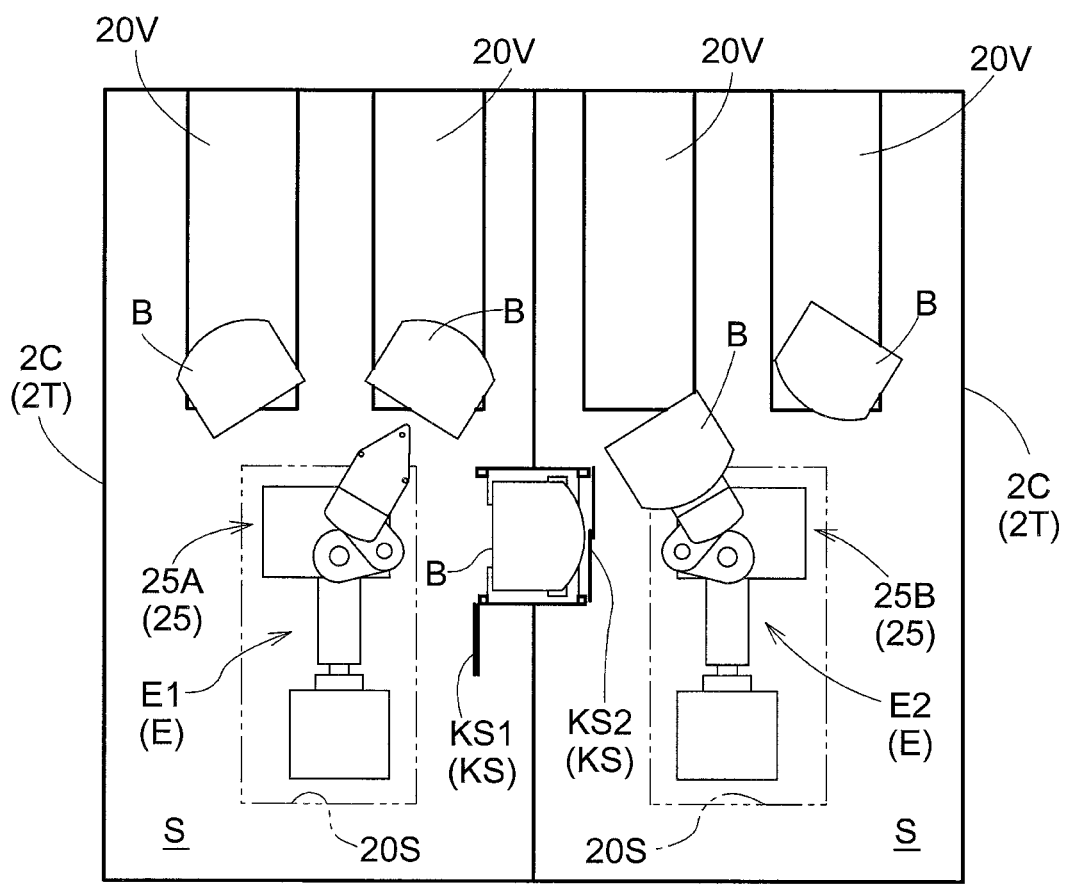
FIG. 9 shows how a shutter operates when second raising and lowering transport device malfunctions.

As shown in FIG. 9, the space in which the storage-purpose receiving platform T exists and the space on the side of the second raising and lowering transport device E2 can be divided and isolated from each other by closing the second shutter KS2. In other words, the operating space of the transfer device 25 of the first raising and lowering transport device E1 and the space on the side of the second raising and lowering transport device E2 can be divided and isolated from each other by closing the second shutter KS2. Therefore, a worker can be prevented from entering into the operating space of the transfer device 25 of the first raising and lowering transport device E1, for example, when performing maintenance work on the second raising and lowering transport device E2. Thus, the worker can safely perform the maintenance work on the second raising and lowering transport device E2 while allowing the first raising and lowering transport device E1 to continue operating in an automatic operation mode described later.

Similarly, the space in which the storage-purpose receiving platform T exists and the space on the side of the first raising and lowering transport device E1 can be divided and isolated from each other by closing the first shutter KS1. In other words, the operating space of the transfer device 25 of the second raising and lowering transport device E2 and the space on the side of the first raising and lowering transport device E1 can be divided and isolated from each other by closing the first shutter KS1. Therefore, a worker can be prevented from entering into the operating space of the transfer device 25 of the second raising and lowering transport device E2, for example, when performing maintenance work on the first raising and lowering transport device E1. Thus, the worker can safely perform the maintenance work on the first raising and lowering transport device E1 while allowing the second raising and lowering transport device E2 to continue operating in the automatic operation mode described later.

When describing the first shutter KS1 and the second shutter KS2 collectively or when one does not have to be distinguished from the other in the following description, they will simply be referred to as the shutter or shutters KS. The shutter KS is, or functions as, a partition of the present invention. The shutter KS is a partition that divides the operating space, of the transfer device 25 of the raising and lowering transport device E (on which maintenance work is to be performed) when performing the transfer operation of a container B, into the space in which the storage-purpose receiving platform T exists and the space in which the raising and lowering transport device E on which the maintenance work is to be performed exists. This partition or partitions (shutter or shutters KS) is or are provided to each floor in which the storage-purpose receiving platform T is installed. And the shutter KS is configured to be switched between an operating state in which the shutter KS divides the operating space, and a non-operating state. Further, the shutter KS, in its operating state, is configured to allow the transfer of a container B to the storage-purpose receiving platform T by the transfer device 25 of the other raising and lowering transport device E that is different from the raising and lowering transport device E on which the maintenance work is to be performed.

While not shown, a work platform plate for a worker to stand on when performing maintenance can be installed to the passage opening 20S formed in the floor F. This work platform plate is configured to be switched between an installed state in which the work platform plate covers the passage opening 20S from above and the non-installed state in which it does not cover the passage opening 20S. More specifically, the work platform plate is configured to be slidingly moved along slide rails installed along opposing edges of the passage opening 20S, which is rectangular in shape in plan view. Further, the work platform plate can be folded in half about a hinge having a pivot axis extending along a direction that perpendicularly intersects the direction of its sliding motion as seen along a horizontal direction. To allow the raising and lowering movement of the raised-and-lowered member 21 (i.e., when maintenance work is not performed), the work platform plate is switched to its non-installed state by folding it in half and sliding it to a lateral side of the passage opening 20S. This allows the raised-and-lowered member 21 to pass through the passage opening 20S and to be raised and lowered. On the other hand, when a worker performs maintenance work, the work platform plate is switched to its installed state by causing it to slide to the position at which the plate covers half of the passage opening 20S and then unfolding it about the hinge. Thus, the work platform on which the worker can perform maintenance work is placed over the area of the passage opening 20S in plan view while preventing maintenance tools, etc. from falling through the passage opening 20S.

Next, reference is made to FIG. 7 to describe how the inter-floor transport facility 2 of the present embodiment is controlled. The controller H may be a general purpose computer such as a personal computer or a server, having a central processing unit and memory storage, such as a hard disk. Connected to the controller H for mutual communication are the first raising and lowering transport device E1 (the first raising and lowering actuator 26A, the first arm actuator 23A, the first proximity sensor 29A, and the first shutter actuator KM1) and the second raising and lowering transport device E2 (the second raising and lowering actuator 26B, the second arm actuator 23B, the second proximity sensor 29B, and the second shutter actuator KM2). The controller H controls operations of the first raising and lowering actuator 26A, the second raising and lowering actuator 26B, the first arm actuator 23A, the second arm actuator 23B, the first shutter actuator KM1, and the second shutter actuator KM2. In addition, detected information from the first proximity sensor 29A and the second proximity sensor 29B is inputted into the controller H, which obtain the detected information.

In the present embodiment, an example is illustrated in which the single controller H controls the actuators for the first raising and lowering transport device E1 (i.e., the first raising and lowering actuator 26A, the first arm actuator 23A, and the first shutter actuator KM1) as well as the actuators for the second raising and lowering transport device E2 (i.e., the second raising and lowering actuator 26B, the second arm actuator 23B, and the second shutter actuator KM2). However, a controller for controlling each actuator of the first raising and lowering transport device E1 and a controller for controlling each actuator of the second raising and lowering transport device E2 may be separately provided such that these controllers cooperate with each other. That is, one or more controllers H for controlling the operations of the plurality of raising and lowering transport devices E may be provided.

The controller H performs or executes an automatic operation mode for automatically transporting a container B from a transport origin to a transport destination based on a transport command from a superordinate managing portion Hu. The controller H is configured to perform, in this automatic operation mode, mutually exclusive transfer control to prevent mutual interference between the transfer devices 25 of the plurality of raising and lowering transport devices E. Here the mutually exclusive transfer control is one in which when one of the plurality of transfer devices 25 is performing a transfer operation to or from a storage-purpose receiving platform T (subject storage-purpose receiving platform T), any transfer operation by the other transfer device 25, or other transfer devices 25, to or from any storage-purpose receiving platform T (including the subject storage-purpose receiving platform T) provided on the same floor as the subject storage-purpose receiving platform T is prohibited.

Figure 8:
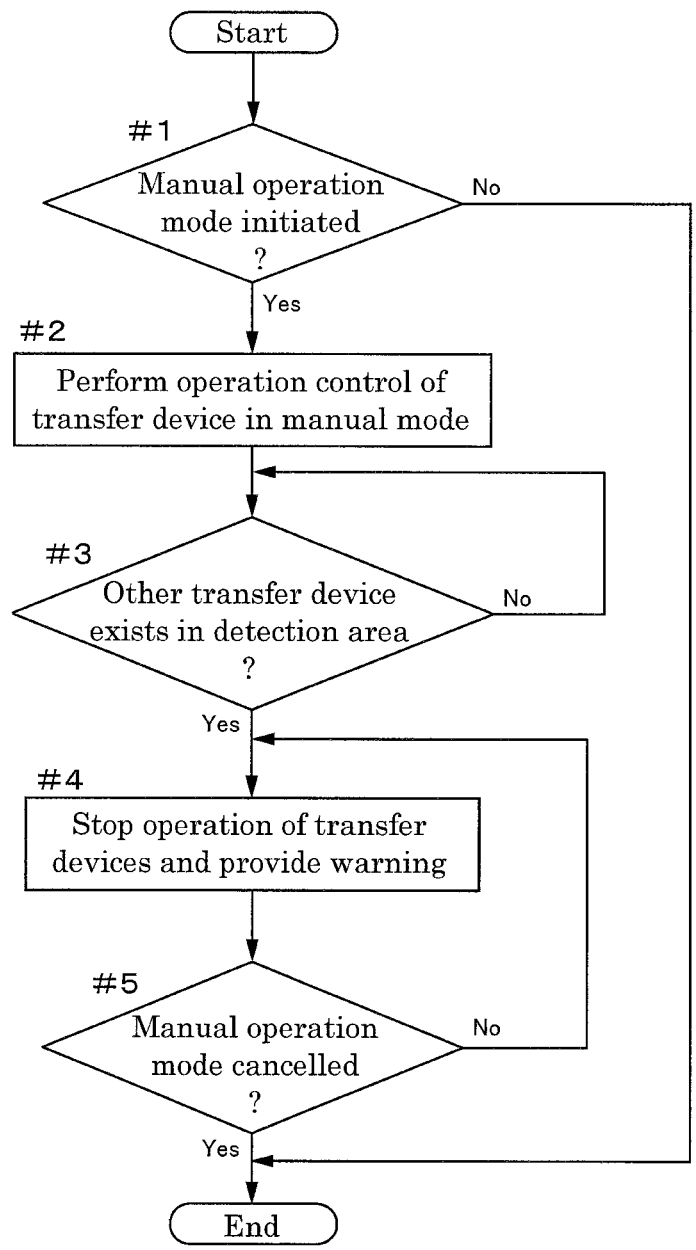
FIG. 8 is a flow chart illustrating an interference avoiding control.

Control for when maintenance work is performed in the inter-floor transport facility 2 of the present embodiment is described next with reference to the flowchart of FIG. 8. When performing maintenance work, the operation of the raising and lowering transport device E on which the maintenance work is to be performed is switched from the automatic operation mode described above to a manual operation mode in which the raising and lowering transport device E is caused to be operated by commands from a worker. The mode may be changed by a mode switching command from the controller H, or by another controller not shown, etc.

When the controller H detects that this manual operation mode has been initiated ("Yes" in Step #1), an operation control of the transfer device in the manual operation mode is performed (Step #2). More specifically, extending and retracting operation and raising and lowering operation of the arm are performed based on a command input by the worker from a manual control controller. During these operations, the controller H performs interference avoiding control if and when it is detected that a transfer device 25 of other raising and lowering transport devices E exists in the detection area of the proximity sensor 29 of the raising and lowering transport device E on which the maintenance work is performed. That is, the controller H stops both the operation of the transfer device 25 of the raising and lowering transport device E on which the maintenance work is performed and the operation of the transfer device 25 of the raising and lowering transport device E on which the maintenance work is not performed (that is, the one detected by the proximity sensor 29) and, at the same time, causes the manual control controller to display an alarm (Step #4).

In present embodiment, the operation of Step #4 described above is the interference avoiding control. That is, when allowing the plurality of transfer devices 25 to perform transfer operations on the same floor, the controller H performs an interference avoiding control for controlling the operations of the plurality of raising and lowering transport devices E so as to avoid mutual interference among the plurality of transfer devices 25 that are allowed to perform transfer operations on the same floor, based on detected information from at least one proximity sensor 29 of the raising and lowering transport devices E of the plurality of transfer devices 25. The controller H continues to perfom control of Step #2 through Step #4 described above until the manual mode is canceled (Step #5).

[Alternative Embodiments]

Figure 10:
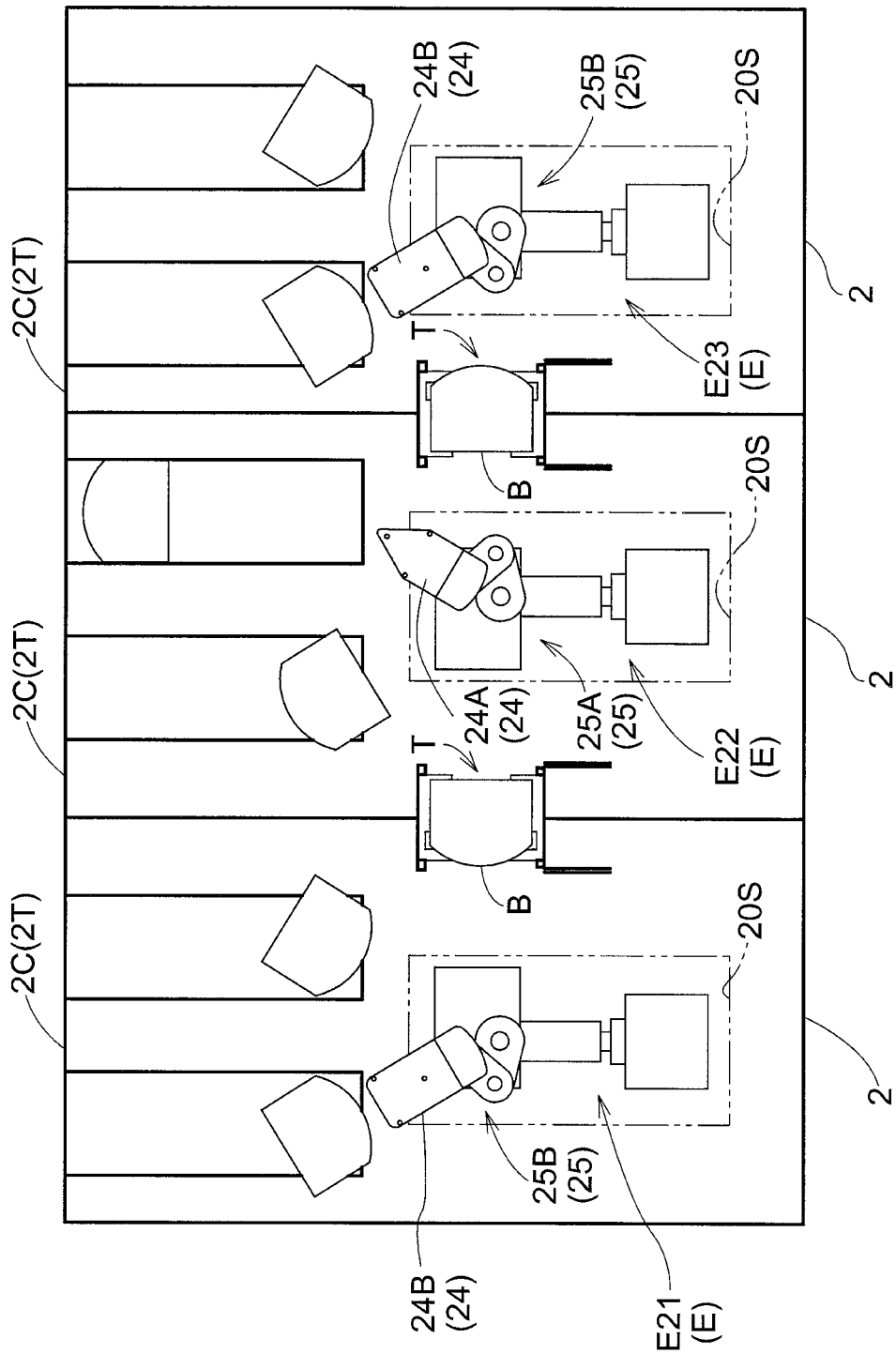
FIG. 10 is a perspective view showing an inter-floor transport facility of an alternative embodiment.

(1) Although an example is described above in which two raising and lowering transport devices E are provided next to each other in the horizontal direction, the invention is not limited to such arrangement. For example, as shown in FIG. 10, three raising and lowering transport devices E (see E21, E22, E23 in FIG. 10) may be provided in a row in the horizontal direction. In this case, the raising and lowering transport devices E21 and E22 as well as the raising and lowering transport devices E22 and E23 are the raising and lowering transport devices E, provided for respective adjacent raising and lowering paths, of the present invention. In addition, in FIG. 10, the transfer support 24 of the raising and lowering transport device E22 is designated to be the first transfer support 24A whereas each of the transfer supports 24 of the raising and lowering transport device E21 and the raising and lowering transport device E23 which are next to the raising and lowering transport device E22 is designated to be the second transfer support 24B. In addition, three or more raising and lowering transport devices E may be arranged horizontally such that all the transfer devices 25 thereof transfer containers B to and from the same storage-purpose receiving platform T. In this case, it is preferable that each raising and lowering transport device E is located such that when one or more shutters KS are switched to the operating states, not all of the raising and lowering transport devices E are on the same side of the shutter or shutters KS.

Figure 11:
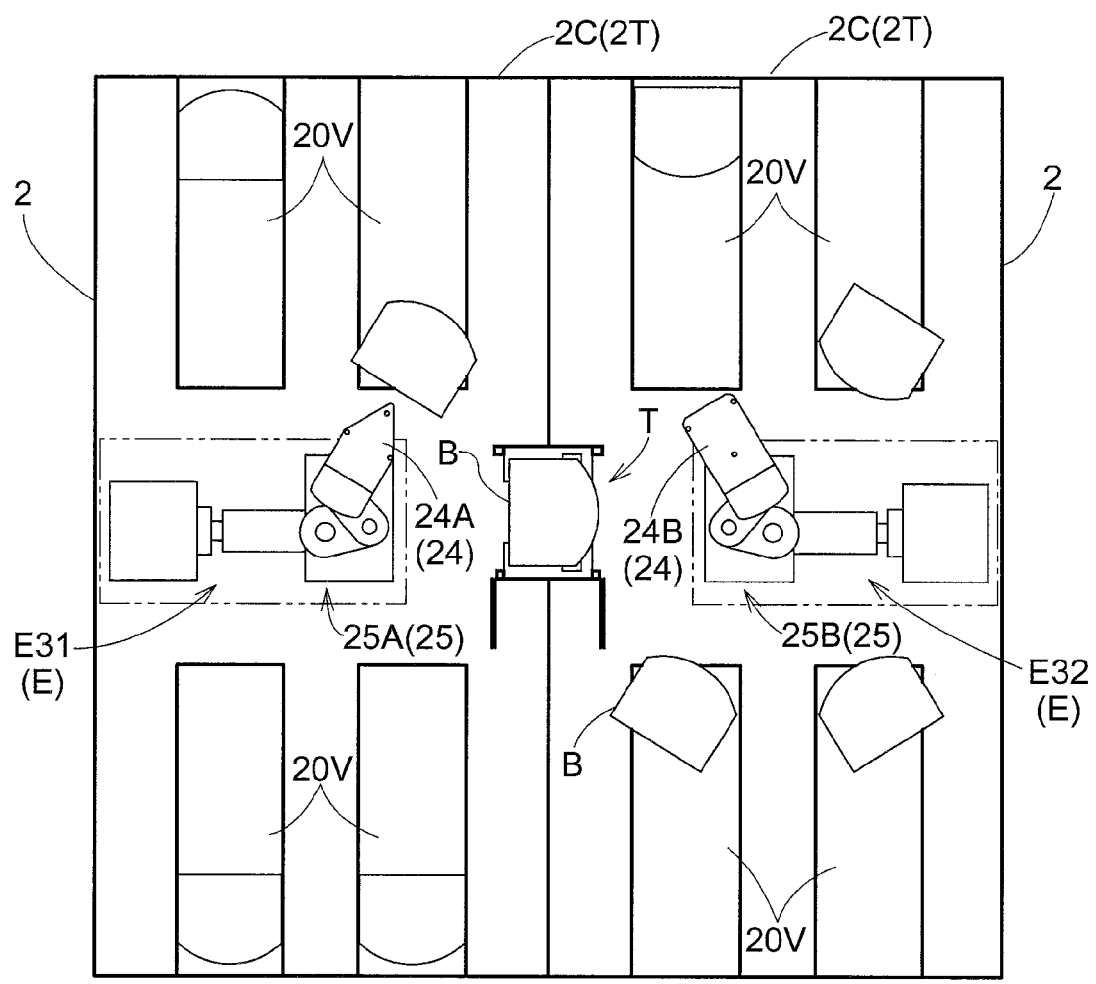
FIG. 11 is a perspective view showing an inter-floor transport facility of another alternative embodiment.

(2) An example is described above in which the container carrying conveyors 20V are provided for, and near, only one of the surfaces that extend along the direction along which adjacent entrance and exit defining portions 2C are spaced apart from each other. However, as shown in FIG. 11, the container carrying conveyors 20V may be provided for, and near, both of the surfaces that extend along the direction along which adjacent entrance and exit defining portions 2C are spaced apart from each other. In other words, the positional relationship of the raising and lowering transport device E and the container carrying conveyors 20V in plan view as well as the number of the installed container carrying conveyor 20V may be selected as desired or appropriate.

(3) An example is described above in which a plurality of storage-purpose receiving platforms T are provided one above another in the vertical direction on the same floor such that the platforms T are located at the same position in an overlapping fashion in plan view. However, the invention is not limited to such arrangement. For example, only one storage-purpose receiving platform T may be provided in the vertical direction on any one floor or more than one storage-purpose receiving platforms T may be arranged horizontally. That is, as long as the storage-purpose receiving platform or platforms T is or are located at such position or positions that allow each the transfer devices 25 of the adjacent raising and lowering transport devices E to access it or them for transfer, the position or positions and the number of the storage-purpose receiving platform or platforms T may be selected as desired or appropriate.

(4) An example is described above in which the entrance and exit defining portion 2C, the overhead transport device 3, or the floor travel type transport device 4 are not provided on the intermediate floor M located between the upper floor U and the lower floor D. However, the intermediate floor M may be provided with the entrance and exit defining portion 2C, the overhead transport device 3, and/or the floor travel type transport device 4. Alternatively, the entrance and exit defining portion or portions 2C, the overhead transport device 3, and/or the floor travel type transport device 4 may be provided on different floors for each of the plurality of the raising and lowering transport devices E. In other words, which floor the entrance and exit defining portion or portions 2C and the overhead transport device 3 or the floor travel type transport device 4 which transport containers B to or from the entrance and exit defining portion or portions 2C should be installed on may be decided as desired or appropriate. Further, an example is described above in which both the overhead transport device 3 and the floor travel type transport device 4 are provided on the same floor. However, only one of the overhead transport device 3 and the floor travel type transport device 4 may be provided on any one floor. And one or more transporting devices (such as belt conveyors) other than the overhead transport device 3 and the floor travel type transport device 4 may be provided to any one of the floors.

(5) An example is described above in which, when it is detected that the transfer device 25 of other raising and lowering transport devices E exists in the detection area of the proximity sensor 29 of the raising and lowering transport device E on which maintenance work is performed, the controller H stops both the operation of the transfer device 25 of the raising and lowering transport device E on which maintenance work is performed and the operation of the transfer device 25 of the raising and lowering transport device E on which maintenance work is not performed (that is, the one detected by the proximity sensor 29). However, the invention is not limited to such arrangement. And the arrangement may be such that, when it is detected that the transfer device 25 of other raising and lowering transport devices E exists in the detection area of the proximity sensor 29 of the raising and lowering transport device E on which maintenance work is performed, the controller H stops only one of the operation of the transfer device 25 of the raising and lowering transport device E on which maintenance work is performed and the operation and the transfer device 25 of the raising and lowering transport device E on which maintenance work is not performed (that is, the one detected by the proximity sensor 29).

(6) An example is described above in which, when allowing a plurality of transfer devices 25 to perform transfer operations on the same floor, the controller H controls, as interference avoiding control, operations of the plurality of raising and lowering transport devices E to avoid interference among the plurality of transfer devices 25 based on the detected information from the proximity sensor 29 of only the raising and lowering transport device E that is caused to operate in the manual operation mode. However, the controller H may control operations of the plurality of raising and lowering transport devices E to avoid interference among the plurality of transfer devices 25 based on the detected information from the proximity sensor 29 of the raising and lowering transport device E that is caused to operate in the manual operation mode and from the proximity sensor 29 of other raising and lowering transport device or devices E.

(7) Although an example is described above in which the controller H performs interference avoiding control based on the detected information from the proximity sensor 29. However, the invention is not limited to such arrangement. For example, the arrangement may be such that the controller H keeps track of, or otherwise manages, the position information of the transfer devices 25 (coordinate values etc.) in real time, and performs interference avoiding control based on the position information of the transfer device 25 of each of the plurality of raising and lowering transport devices E.

(8) An example is described above in which one of the two container carrying conveyors 20V that are located next to each other in the horizontal direction in the entrance and exit defining portion 2C is used as a carrying in container carrying conveyor 20V, which transports containers B that are being carried into a floor whereas the other of the two is used as a carrying out container carrying conveyor 20V, which transports containers B that are being carried out of the floor. However, the invention is not limited to such arrangement. Each of the two container carrying conveyors 20V may be used to both carry in and carry out the containers B.

(9) An example is described above in which the controller H performs mutually exclusive transfer control while allowing one of the plurality of transfer devices to perform transfer operation to or from a storage-purpose receiving platform T. However, the mutually exclusive transfer control is not limited to such control. Instead, while allowing one of the plurality of transfer devices to perform transfer operation to the storage-purpose receiving platform T, the controller H may prohibit other transfer device or devices from performing transfer operation only to or from that particular storage-purpose receiving platform T.

(10) An example is described above in which the shutters KS are provided on all floors (the upper floor U and the lower floor D in the embodiment described above) in which the entrance and exit defining portions 2C are formed. However, the invention is not limited to such arrangement. For example, the shutters KS may be provided only on the upper floor U or only on the lower floor D. And on which floor the shutters KS are provided may be decided as desired or appropriate.

(11) Although an example is described above in which each transfer support 24 supports the container B from below. However, the transfer support 24 may be, for example, one that grips or holds the top end of the container B since a flange to be gripped is provided to any FOUP, or one that grips or holds the container B by its side faces. How the transfer support supports the container B can be chosen as desired or appropriate.

[Summary of Embodiments]

Features of the inter-floor transport device described above are summarized briefly next.

In one embodiment, an inter-floor transport facility for transporting articles among a plurality of floors comprises: raising and lowering paths with each raising and lowering path extending through the plurality of floors; raising and lowering transport devices for transporting the articles among the plurality of said floors, each raising and lowering transport device being configured to be raised and lowered along associated one of the raising and lowering paths; wherein each of the raising and lowering transport devices having a raised-and-lowered member for transporting an article, and configured to be raised and lowered along associated one of the raising and lowering paths, and a transfer device for transferring, on each floor, a transported article among receiving platforms for supporting the articles and the raising and lowering transport device, the transfer device configured to be raised and lowered integrally with the raised-and-lowered member wherein the receiving platforms include a carry in article receiving platform for supporting an article that is being carried in to an associated floor, a carry out article receiving platform for supporting an article that is being carried out from the associated floor, and a storage-purpose receiving platform for temporarily storing a transported article on the associated floor, wherein on each floor, the carry in article receiving platform and the carry out article receiving platform are so located that the article can be transferred between one said transfer device and both of the carry in article receiving platform and the carry out article receiving platform, and wherein on each floor, the storage-purpose receiving platform is so located that all of the transfer devices can transfer the article to or from the storage-purpose receiving platform.

That is, since a plurality of raising and lowering transport devices are provided, even if any of the plurality of raising and lowering transport devices malfunctions, the transporting operation can continue using the raising and lowering transport device or devices that is or are functioning properly so that the transporting function of the whole system can be maintained. In addition, the transfer devices of all the raising and lowering transport devices for the plurality of raising and lowering paths transfer articles to the storage-purpose receiving platform; thus, even if one of the raising and lowering transport devices malfunctions, the article supported by the storage-purpose receiving platform can be carried out by other raising and lowering transport device or devices. Therefore, no article would have to be left on the storage-purpose receiving platform because of a malfunction. As such, with the arrangement described above, an inter-floor transport facility can be provided in which, even if one of the raising and lowering transport devices malfunctions, the transport function of the inter-floor transport facility can be maintained and in which no article would be left unhandled on the storage-purpose receiving platform.

In one embodiment, the inter-floor transport facility preferably further comprises a controller for controlling operations of the raising and lowering transport devices, wherein during a time period in which one of the transfer devices is caused to perform transfer operation to or from the storage-purpose receiving platform on a floor, the controller is preferably configured to perform a mutually exclusive transfer control for prohibiting any other transfer device on the floor from performing transfer operation to or from the storage-purpose receiving platform.

That is, while one of the transfer devices is performing transfer operation to or from its storage-purpose receiving platform, other transfer device or devices do not perform the transfer operation to or from the storage-purpose receiving platform; thus, there is no circumstance in which more than one transfer device performs the transfer operation simultaneously to or from the same storage-purpose receiving platform. Therefore, transfer of an article to or from the storage-purpose receiving platform can be properly performed without causing interference with any other transfer device or with the article supported by any other transfer device.

In one embodiment, in the inter-floor transport facility, each of the raising and lowering transport devices is preferably provided with a proximity sensor for detecting approach of a transfer device of any other raising and lowering transport device, wherein when causing a plurality of the transfer devices to perform transfer operation on a floor, the controller preferably performs interference avoiding control for controlling operations of a plurality of the raising and lowering transport devices based on detected information from at least one said proximity sensor of the raising and lowering transport devices for the plurality of transfer devices, in order to avoid interference among the plurality of the transfer devices that are caused to perform the transfer operation on the floor.

Interference between the plurality of transfer devices can be properly and reliably avoided by controlling operations of the plurality of raising and lowering transport devices based on the detected information from the proximity sensor. Therefore, when performing transfer operations by the transfer devices on the same floor, interference between the transfer devices can be properly or reliably avoided in the event that the transfer devices of the plurality of raising and lowering transport devices come close to each other.

In one embodiment, in the inter-floor transport facility, a partition for dividing an operating space, in which the transfer device of a specific raising and lowering transport device performs transferring operation of an article, into space in which the storage-purpose receiving platform exists and space in which the specific raising and lowering transport device exists, as seen along a direction of the associated one of the raising and lowering paths in plan view, is provided on each floor in which the storage-purpose receiving platform is installed, wherein the partition is preferably configured to be switched between an operating state in which the partition divides the operating space and a non-operating state in which the partition does not divide the operating space, and wherein the partition is preferably provided such as to, in the operating state, allow the transfer device of the specific raising and lowering transport device that is different from the specific raising and lowering transport device to transfer an article to the storage-purpose receiving platform.

For example, a worker may perform maintenance work on a specific raising and lowering transport device. By placing the partition its operating state, the worker can be prevented from unconsciously entering the operating space of the transfer device of the raising and lowering transport device which is adjacent to the specific raising and lowering transport device on which the maintenance work is performed. That is, this arrangement can secure safety of maintenance work.

In one embodiment, in the inter-floor transport facility, each of the transfer devices preferably has a transfer support for supporting a transported article wherein the transfer device, provided to one of at least two raising and lowering transport devices whose raising and lowering paths are adjacent to each other, preferably has a first transfer support for supporting an article in a first orientation, as the transfer support, whereas the transfer device, provided to the other of the at least two raising and lowering transport devices, preferably has a second transfer support for supporting an article in a second orientation which is different from the first orientation, as the transfer support, and wherein the storage-purpose receiving platform, which each of the transfer devices provided to the at least two raising and lowering transport devices can transfer an article to or from, is preferably configured to support an article in a same orientation regardless of whether the article is transferred by the transfer device provided to the one of the at least two raising and lowering transport devices, or by the other of the at least two raising and lowering transport devices.

In addition, in one embodiment, in the inter-floor transport facility, the two transfer devices, provided to respective ones of the at least two raising and lowering transport devices whose raising and lowering paths are adjacent to each other, are preferably located at symmetrical positions with respect to the storage-purpose receiving platform, that is shared by the two transfer devices, located between the positions, and wherein an article is preferably supported on the storage-purpose receiving platform such that a front face thereof faces toward one of the two transfer devices and a back face thereof faces toward the other of the two transfer devices.

With the arrangement described above, the inter-floor transport facility only requires, as a storage-purpose receiving platform, one that supports an article in a single orientation. When providing a storage-purpose receiving platform commonly used by the transfer devices of a plurality of raising and lowering transport devices, there is no need to switch the orientation of the storage-purpose receiving platform when the article is transferred by the first transfer support and when the article is transferred by the second transfer support. In other words, the structure of the storage-purpose receiving platform can be simplified with this arrangement compared to the case where the orientation of the storage-purpose receiving platform can be switched or changed.

In addition, also when three or more raising and lowering transport devices are provided for the plurality of raising and lowering paths, a raising and lowering transport device having the first transfer support and a raising and lowering transport device having the second transfer support can be provided as the plurality of raising and lowering transport devices. And by arranging the storage-purpose receiving platform, which any of the transfer devices of three or more raising and lowering transport devices can transfer an article to or from, to support the article in the same orientation regardless of whether the article is transferred by the transfer device having the first transfer support or by the transfer device having the second transfer support, the structure of the storage-purpose receiving platform can be simplified compared to the case where the orientation of the storage-purpose receiving platform can be switched or changed as described above.

What is claimed is:

1. An inter-floor transport facility for transporting articles among a plurality of floors, the inter-floor transport facility comprising:
    raising and lowering paths with each raising and lowering path extending through the plurality of floors, the raising and lowering paths arranged adjacent each other; and
    raising and lowering transport devices for transporting the articles among the plurality of said floors, each raising and lowering transport device being configured to be raised and lowered along associated one of the raising and lowering paths;
    wherein each of the raising and lowering transport devices having a raised-and-lowered member for transporting an article of said articles and configured to be raised and lowered along associated one of the raising and lowering paths, and a transfer device for transferring, on each floor, a transported article of said articles among receiving platforms for supporting the articles and the raising and lowering transport device, the transfer device configured to be raised and lowered integrally with the raised-and-lowered member,
    wherein on each floor, an in-floor transport device is provided for transporting an article of said articles in said floor,
    wherein the receiving platforms include a carry in article receiving platform, a carry out article receiving platform, and storage-purpose receiving platform,
    wherein, the carry in article receiving platform is for conveying an article of said articles that is being carried in to the in-floor transport device on an associated floor of said plurality of floors,
    wherein the carry out article receiving platform is for conveying an article of said articles that is being carried out from the in-floor transport device on the associated floor,
    wherein the storage-purpose receiving platform is for temporarily storing an article of said articles on the associated floor, the article being to be transported between different floors,
    wherein on each floor, the carry in article receiving platform and the carry out article receiving platform are so located that the article can be transferred between only one said transfer device and both of the carry in article receiving platform and the carry out article receiving platform, and
    wherein on each floor, the storage-purpose receiving platform is so located that a plurality of the transfer devices of said raising and lowering transport devices can transfer the article to or from the storage-purpose receiving platform.

2. The inter-floor transport facility as defined in claim 1, further comprising:
    a controller for controlling operations of the raising and lowering transport devices, wherein during a time period in which one of the transfer devices is caused to perform a transfer operation to or from the storage-purpose receiving platform on a floor of said plurality of floors, the controller is configured to perform a mutually exclusive transfer control for prohibiting any other transfer device on the floor from performing transfer operation to or from the storage-purpose receiving platform.

3. The inter-floor transport facility as defined in claim 1, wherein
each of the raising and lowering transport devices is provided with a proximity sensor for detecting approach of a transfer device of any other raising and lowering transport device, and
wherein, when causing a plurality of the transfer devices to perform transfer operation on a floor of said plurality of floors, the controller performs interference avoiding control for controlling operations of a plurality of the raising and lowering transport devices based on detected information from at least one said proximity sensor of the raising and lowering transport devices for the plurality of transfer devices, in order to avoid interference among the plurality of the transfer devices that are caused to perform the transfer operation on the floor.

4. The inter-floor transport facility as defined in claim 1, wherein
a partition for dividing an operating space, in which the transfer device of a specific raising and lowering transport device performs transferring of an article of said articles, into space in which the storage-purpose receiving platform exists and space in which the specific raising and lowering transport device exists, as seen along a direction of the associated one of the raising and lowering paths in plan view, is provided on each floor in which the storage-purpose receiving platform is installed,
wherein the partition is configured to be switched between an operating state in which the partition divides the operating space and a non-operating state in which the partition does not divide the operating space, and
wherein the partition is provided such as to, in the operating state, allow the transfer device of the raising and lowering transport device that is different from the specific raising and lowering transport device to transfer an article of said articles to the storage-purpose receiving platform.

5. The inter-floor transport facility as defined in claim 1, wherein
each of the transfer devices has a transfer support for supporting a transported article of said articles,
wherein the transfer device, provided to one of at least two raising and lowering transport devices whose raising and lowering paths are adjacent to each other, has a first transfer support for supporting an article of said articles in a first orientation, as the transfer support, whereas the transfer device, provided to the other of the at least two raising and lowering transport devices, has a second transfer support for supporting an article of said articles in a second orientation which is different from the first orientation, as the transfer support,
wherein the storage-purpose receiving platform, which each of the transfer devices provided to the at least two raising and lowering transport devices can transfer an article of said articles to or from, is configured to support an article of said articles in a same orientation regardless of whether the article is transferred by the transfer device provided to the one of the at least two raising and lowering transport devices, or by the other of the at least two raising and lowering transport devices.

6. The inter-floor transport facility as defined in claim 5, wherein
the two transfer devices, provided to respective ones of the at least two raising and lowering transport devices whose raising and lowering paths are adjacent to each other, are located at symmetrical positions with respect to the storage-purpose receiving platform, that is shared by the two transfer devices, located between the positions, and
wherein an article of said articles is supported on the storage-purpose receiving platform such that a front face thereof faces toward one of the two transfer devices and a back face thereof faces toward the other of the two transfer devices.

7. The inter-floor transport facility as defined in claim 1, wherein on each floor, the storage-purpose receiving platform is disposed between a plurality of raising and lowering paths so that the article can be transferred between the storage-purpose receiving platform and any of the transfer devices.

* * * * *

UNITED STATES PATENT AND TRADEMARK OFFICE
CERTIFICATE OF CORRECTION

PATENT NO. : 9,815,624 B2
APPLICATION NO. : 14/797433
DATED : November 14, 2017
INVENTOR(S) : Hideo Yoshioka Page 1 of 1

It is certified that error appears in the above-identified patent and that said Letters Patent is hereby corrected as shown below:

In the Claims

Column 20, Line 40, Claim 1, after "and" insert -- a --

Column 20, Line 41, Claim 1, delete "wherein," and insert -- wherein --

Signed and Sealed this
Twentieth Day of February, 2018

Andrei Iancu
*Director of the United States Patent and Trademark Office*